United States Patent
Lee et al.

(10) Patent No.: US 8,241,936 B2
(45) Date of Patent: Aug. 14, 2012

(54) DISPLAY SUBSTRATE, METHOD OF MANUFACTURING THE SAME AND DISPLAY PANEL HAVING THE SAME

(75) Inventors: Je-Hun Lee, Seoul (KR); Young-Min Kim, Gyeonggi-do (KR); Bo-Sung Kim, Seoul (KR); Jun-Young Lee, Gyeonggi-do (KR); Sung-Wook Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/230,111

(22) Filed: Sep. 12, 2011

(65) Prior Publication Data

US 2012/0003796 A1  Jan. 5, 2012

Related U.S. Application Data

(62) Division of application No. 11/646,832, filed on Dec. 27, 2006, now Pat. No. 8,035,102.

(30) Foreign Application Priority Data

Dec. 28, 2005 (KR) .................. 10-2005-0131918

(51) Int. Cl.
*H01L 20/00* (2006.01)
(52) U.S. Cl. . 438/30; 257/59; 257/E27.13; 257/E31.097
(58) Field of Classification Search ............ 257/59, 257/E27.13; 438/30
See application file for complete search history.

(56) References Cited

U.S. PATENT DOCUMENTS

| | | | |
|---|---|---|---|
| 5,548,301 A * | 8/1996 | Kornher et al. | 345/85 |
| 6,320,214 B1 | 11/2001 | Matsuda et al. | |
| 2004/0027891 A1 * | 2/2004 | Hartmann | 365/202 |
| 2004/0227891 A1 | 11/2004 | Hirota | |
| 2004/0233368 A1 | 11/2004 | Kim et al. | |
| 2004/0257509 A1 * | 12/2004 | Lee et al. | 349/139 |
| 2005/0122351 A1 | 6/2005 | Yamazaki et al. | |
| 2005/0176185 A1 * | 8/2005 | Jang et al. | 438/155 |

FOREIGN PATENT DOCUMENTS

KR    1020010057019 A    7/2001

* cited by examiner

*Primary Examiner* — Thao Le
*Assistant Examiner* — Matthew Gordon
(74) *Attorney, Agent, or Firm* — Innovation Counsel LLP

(57) ABSTRACT

An improved display substrate is provided to reduce surface defects on insulating layers of organic thin film transistors. Related methods of manufacture are also provided. In one example, a display substrate includes a base, a plurality of data lines, a plurality of gate lines, a pixel defined by the data lines and the gate lines, an organic thin film transistor, and a pixel electrode. The data lines are on the base and are oriented in a first direction. The gate lines are oriented in a second direction that crosses the first direction. The organic thin film transistor includes a source electrode electrically connected to one of the data lines, a gate electrode electrically connected to one of the gate lines, and an organic semiconductor layer. The pixel electrode is disposed in the pixel and electrically connected to the organic thin film transistor. The pixel electrode comprises a transparent oxynitride.

9 Claims, 17 Drawing Sheets

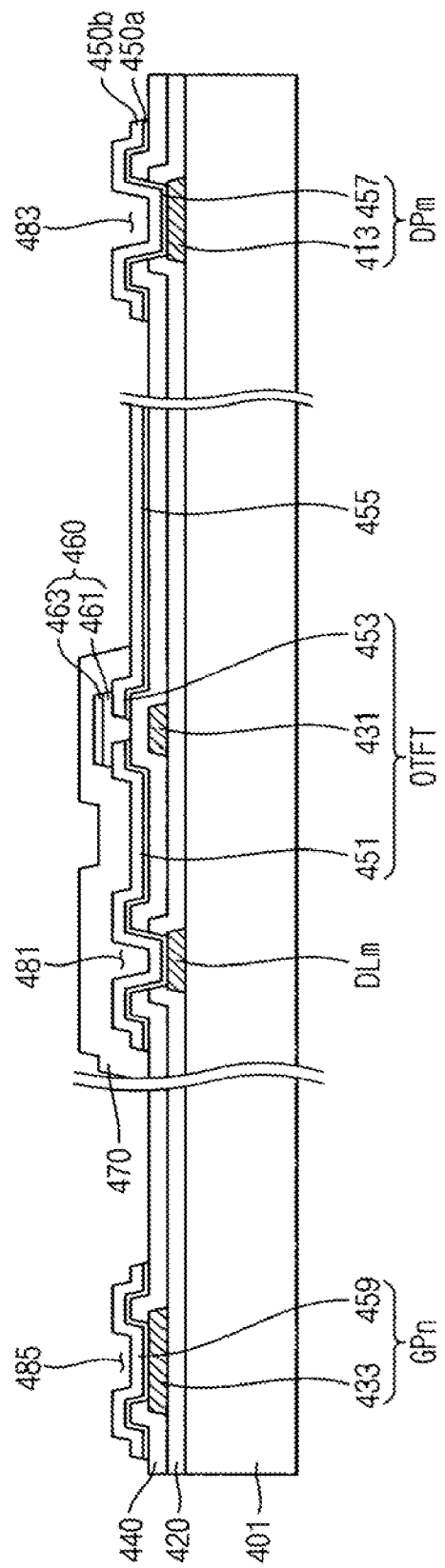

DISPLAY SUBSTRATE, METHOD OF MANUFACTURING THE SAME AND DISPLAY PANEL HAVING THE SAME

CROSS-REFERENCE TO RELATED APPLICATION

This application is a divisional of, and claims benefit of, U.S. patent application Ser. No. 11/646,832 filed Dec. 27, 2006, where the latter claims priority to Korean Patent Application No. 10-2005-00131918, filed in the Korean Intellectual Property Office, Republic of Korea, on Dec. 28, 2005, the disclosures of both of which applications are incorporated herein by reference in their entireties.

BACKGROUND

1. Field of the Invention

The present invention relates generally to a display substrate, a method of fabricating the same, and a display panel having the same. More particularly, the present invention relates to a display substrate for liquid crystal displays (LCDs).

2. Description of Related Art

Liquid crystal displays (LCDs) are one of the most widely used types of flat panel displays. An LCD includes two substrates provided with field-generating electrodes and a liquid crystal (LC) layer interposed therebetween. The LCD displays images by applying voltages to the field-generating electrodes to provide an electric field in the LC layer, which determines orientations of LC molecules in the LC layer to affect the polarization of light passing therethrough.

Typically, one substrate includes a plurality of gate lines, a plurality of data lines across the gate lines, and pixels defined by the gate lines and the data lines. Each pixel includes a pixel electrode and a thin film transistor to control a voltage applied to the pixel electrode. During manufacture, the thin film transistor array substrate is typically exposed to high temperatures in the range of about 250° C. to about 400° C. For example, in order to deposit a conventional gate insulating layer and a conventional semiconductor layer on the array substrate through a plasma chemical vapor deposition process, the array substrate may be exposed to temperatures above 250° C.

Recently, thin film transistor array substrates formed of organic material have been developed. Such substrates may be formed at low temperatures and may include a gate insulating layer formed of organic insulating material and a channel layer formed of an organic semiconductor.

However, the surface of the gate insulating layer may become damaged during the formation of a pixel electrode thereon. Such surface damage can cause defects in the organic semiconductor formed on the gate insulating layer, resulting in reduced transmittance of the pixel electrode. Accordingly, there is a need for an improved approach to organic thin film transistors that reduces the potential surface damage to gate insulating layers associated with existing designs.

SUMMARY

In an exemplary display substrate according to an embodiment of the present invention, the display substrate includes a base, a plurality of data lines, a plurality of gate lines, a pixel, an organic thin film transistor, and a pixel electrode. The data lines are on the base and are oriented in a first direction. The gate lines are oriented in a second direction that crosses the first direction. The pixel is defined by the data lines and the gate lines. The organic thin film transistor includes a source electrode electrically connected to one of the data lines, a gate electrode electrically connected to one of the gate lines, and an organic semiconductor layer. The pixel electrode is disposed in the pixel and electrically connected to the organic thin film transistor. The pixel electrode comprises a transparent oxynitride.

In an exemplary method for manufacturing a display substrate according to another embodiment of the present invention, the method includes forming a data line on a base, wherein the data line is oriented in a first direction; forming a gate line and a gate electrode electrically connected to the gate line, wherein the gate line is oriented in a second direction that crosses the first direction; forming a first insulating layer on the gate line and the gate electrode; forming a transparent conductor on the insulating layer, wherein the transparent conductor comprises an oxynitride; and patterning the transparent conductor to form a source electrode electrically connected to the data line, a pixel electrode, and a drain electrode integrally formed with the pixel electrode.

In an exemplary display panel according to another embodiment of the present invention, the display panel includes an array substrate, a color filter substrate, and a liquid crystal layer interposed between the array substrate and the color filter substrate. The array substrate includes a pixel, an organic thin film transistor, and a pixel electrode. The pixel is defined by a plurality of data lines and a plurality of gate lines. The data lines are oriented in a first direction and the gate lines are oriented in a second direction that crosses the first direction. The organic thin film transistor is formed in the pixel and includes a source electrode electrically connected to one of the data lines, a drain electrode, and a gate electrode electrically connected to one of the gate lines. The pixel electrode is electrically connected to the drain electrode and comprises transparent oxynitride.

BRIEF DESCRIPTION OF THE DRAWINGS

The features of the present invention will become apparent to those of ordinary skill in the art by referring to the following detailed description and the attached drawings in which:

FIGS. 4A to 4B are cross-sectional views showing various process steps for manufacturing a display substrate according to another embodiment of the present invention;

DETAILED DESCRIPTION

Figure 1:
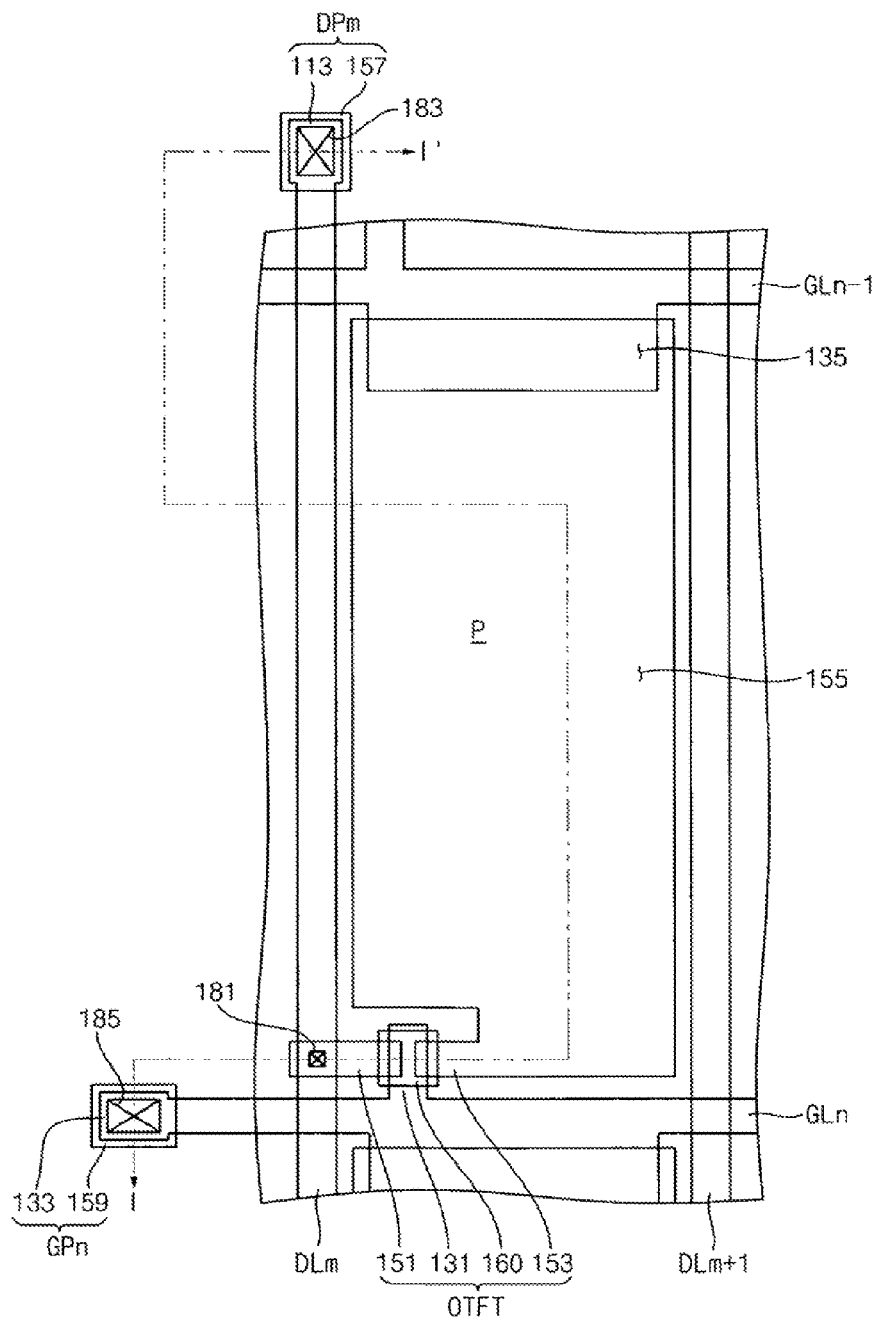
FIG. 1 is a plan view of a display substrate according to an embodiment of the present invention.

FIG. 1 is a plan view of a display substrate according to an embodiment of the present invention. The display substrate includes a plurality of data lines DLm and DLm+1 oriented in a longitudinal direction, and a plurality of gate lines GLn−1 and GLn oriented in a transverse direction that crosses the longitudinal direction. Data lines DLm and DLm+1 and gate lines GLn−1 and GLn define pixels P. Each pixel P includes a pixel electrode 155, an organic thin film transistor OTFT, and a storage capacitor electrode 135.

End portions of data lines DLm and DLm+1 include data pad regions for receiving applied data signals. End portions of gate lines GLn−1 and GLn include gate pad regions for receiving applied gate signals. For example, a data pad DPm is formed at the end of data line DLm, and a gate pad GPn is formed at the end of gate line GLn.

Data lines DLm and DLm+1 and gate lines GLn−1 and GLn may be formed of copper (Cu), copper alloys, aluminum (Al), aluminum alloys, silver (Ag), silver alloys, molybdenum (Mo), molybdenum alloys, chromium (Cr), tantalum (Ta), titanium (Ti), or other material.

Data pad DPm includes an end portion 113 of data line DLm and a contact assistant 157 electrically connected with end portion 113. Gate pad GPn includes an end portion 133 of gate line GLn and a contact assistant 159 electrically connected with end portion 133. In one embodiment, pixel electrode 155 and contact assistants 157 and 159 are formed of the same conductive material.

Organic thin film transistor OTFT includes a source electrode 151 electrically connected to data line DLm, a gate electrode 131 formed with gate line GLn, and a drain electrode 153 integrally formed with pixel electrode 155. In one embodiment, source electrode 151 and drain electrode 153 are formed of the same conductive material as pixel electrode 155. Source electrode 151 is connected to data line DLm through a first contact hole 181. A channel 160 of organic thin film transistor OTFT includes an organic semiconductor layer. In various embodiments, the organic semiconductor layer may be formed of pentacene, polythiophene, or linear polycyclic aromatic hydrocarbon such as naphthalene, anthracene, or tetracene. A gate insulating layer is formed on gate electrode 131.

Pixel electrode 155 is formed on the gate insulating layer and may be formed of transparent conductive material such as oxynitride having indium (In), tin (Sn), zinc (Zn), aluminum (Al), or gallium (Ga). The transparent conductive material may include amorphous indium tin oxynitride (a-ITON) or indium zinc oxynitride (IZON).

In one embodiment, storage capacitor electrode 135 is integrally formed with and electrically connected with gate line $GL_{n-1}$. Accordingly, storage capacitor electrode 135 may share a common gate-off voltage with gate line $GL_{n-1}$. In another embodiment, storage capacitor electrode 135 can be formed separately from gate line $GL_{n-1}$ and use a voltage separately applied to a storage line.

Figure 2:
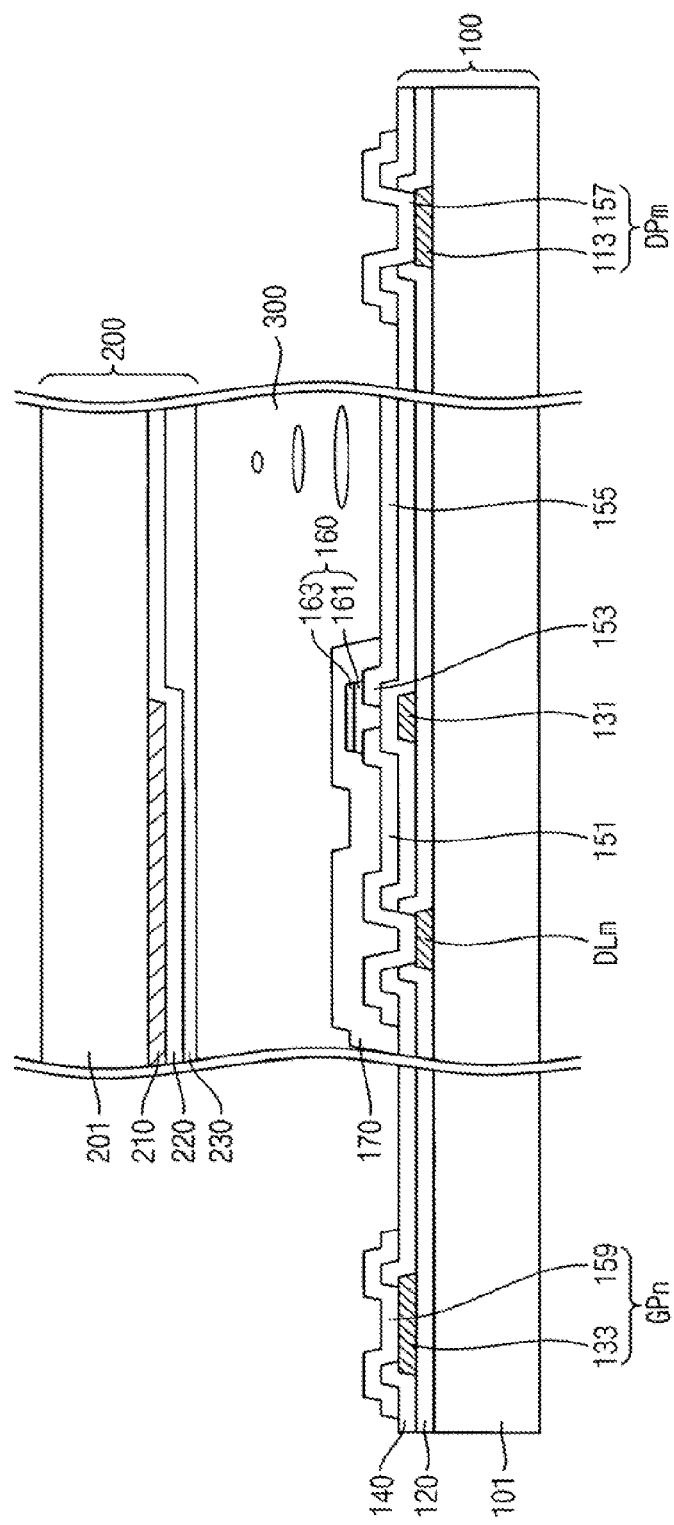
FIG. 2 is a cross-sectional view of a display panel taken along line I-I' of the display substrate of FIG. 1 in accordance with an embodiment of the present invention.

FIG. 2 is a cross-sectional view of a display panel taken along line I-I' of the display substrate of FIG. 1 in accordance with an embodiment of the present invention. Referring to FIGS. 1 and 2, the display panel includes an array substrate 100 (i.e., a display substrate), a color filter substrate 200, and a liquid crystal layer 300 interposed therebetween. Array substrate 100 includes a first base 101 on which data lines DLm and DLm+1 are formed, including end portion 113 of data pad DPm. A base insulating layer 120 is formed on data lines DLm and DLm+1 and first base 101. Base insulating layer 120 may be formed of inorganic material such as silicon nitride (SiNx) or silicon oxide (SiOx), or organic material. Gate lines GLn−1 and GLn, gate electrode 131, and storage capacitor electrode 135 are formed on base insulating layer 120.

A gate insulating layer 140 is formed on gate electrode 131 and a portion of base insulating layer 120. Gate insulating layer 140 may be formed of a dielectric material having a high dielectric constant and may include an initiator such as a polymer (e.g., polyvinyl butyral (PVB)), an organic-inorganic mixture (e.g., organo silane), or an organometallic material (e.g., organic titanate). The dielectric material may include ferroelectric material such as $BaxSr_{1-x}TiO_3$ (barium strontium titanate), $Ta_2O_5$, $Y_2O_3$, $TiO_2$, $PbZr_xTi_{1-x}O_3$ (PZT), $Bi_4Ti_3O_{12}$, $BaMgF_4$, $SrBi_2(Ta_{1-x}NB_x)_2O_9$, $Ba(Zr_{1-x}Ti_x)O_3$ (BZT), $BaTiO_3$, $SrTiO_3$, $Bi_4Ti_3O_{12}$, or other material.

A transparent conductor is deposited and patterned to form pixel electrode 155, drain electrode 153, source electrode 151, and contact assistants 157 and 159. Contact assistants 157 and 159 are electrically connected to end portions 113 and 133 of data line DLm and gate line GLn through a second contact hole 183 and a third contact hole 185, respectively. The transparent conductor may include a transparent conductive material such as an oxynitride formed by adding nitrogen to oxide containing In, Sn, Zn, Al, or Ga. In one embodiment, the transparent conductor includes a-ITON or IZON.

If the transparent conductor includes amorphous indium tin oxide (a-ITO) or amorphous indium zinc oxide (a-IZO), the surface of gate insulating layer 140 may be damaged during deposition and etching of the transparent conductor. In this regard, protrusions may be generated on the surface of gate insulating layer 140, thereby causing defects on organic semiconductor layer 161 formed thereon. This may degrade organic thin film transistor OTFT and reduce light transmittance of pixel electrode 155.

In accordance with various embodiments of the present invention, oxynitride may be used to form the transparent conductor in order to reduce such protrusions and their associated effects as will be explained with reference to examples further described herein.

Organic semiconductor layer 161 and a stopper layer 163 are sequentially deposited and patterned above drain electrode 153 and source electrode 151 to form channel 160. A passivation layer 170 is formed to protect and insulate organic thin film transistor OTFT.

Color filter substrate 200 includes a second base 201, light-blocking patterns 210 (e.g., black matrixes), color filters 220, and a common electrode 230. Light-blocking patterns 210 are formed on second base 201 to prevent light leakage and delineate the areas corresponding to pixel P. Color filters 220 are formed on portions of light-blocking patterns 210 and second base 201 and represent at least one primary color: red, green, and/or blue. An overcoat (not shown) can be formed on color filters 220 and light-blocking patterns 210 to planarize the upper surface of second base 201.

Common electrode 230 is formed on color filters 220. Pixel electrode 155, common electrode 230, and liquid crystal layer 300 therebetween form a liquid crystal capacitor (CLC). Voltages applied between pixel electrode 155 and common electrode 230 determine the orientation of liquid crystal molecules of liquid crystal layer 300.

Figure 3A:
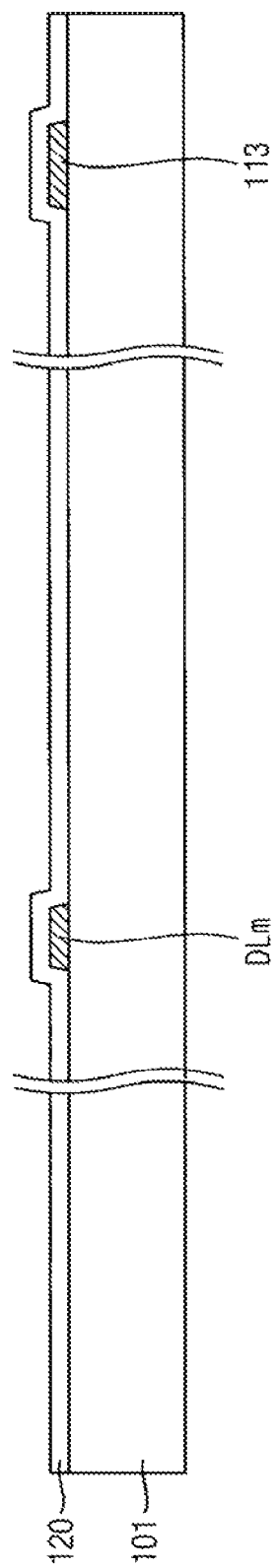
FIGS. 3A to 3E are cross-sectional views showing various process steps for manufacturing the display substrate of FIG. 1 according to an embodiment of the present invention.

FIGS. 3A to 3E illustrate various process steps for manufacturing the array substrate of FIG. 1. Referring to FIGS. 1 and 3A, a metal layer is deposited on a first base 101 and patterned to form data lines DLm and DLm+1 and end portion 113. As illustrated, data lines DLm and DLm+1 are oriented in a longitudinal direction, and ending portion 113 exhibits a comparatively large width. Base insulating layer 120 is formed on data lines DLm and DLm+1.

Figure 3B:
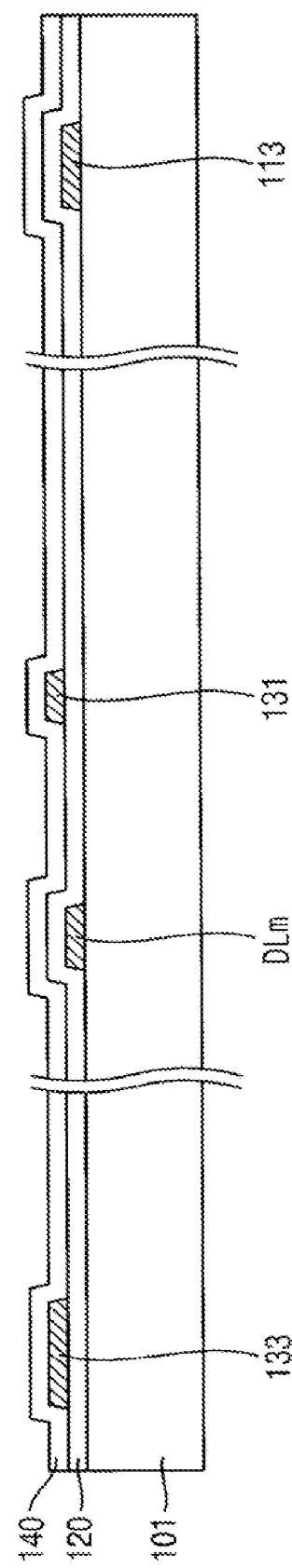

Referring to FIGS. 1 and 3B, gate lines GLn−1 and GLn, gate electrode 131, end portion 133 of gate line GLn, and storage electrode 135 are formed on base insulating layer 120. Gate insulating layer 140 is formed on gate lines GLn and a portion of base insulating layer 120.

Figure 3C:
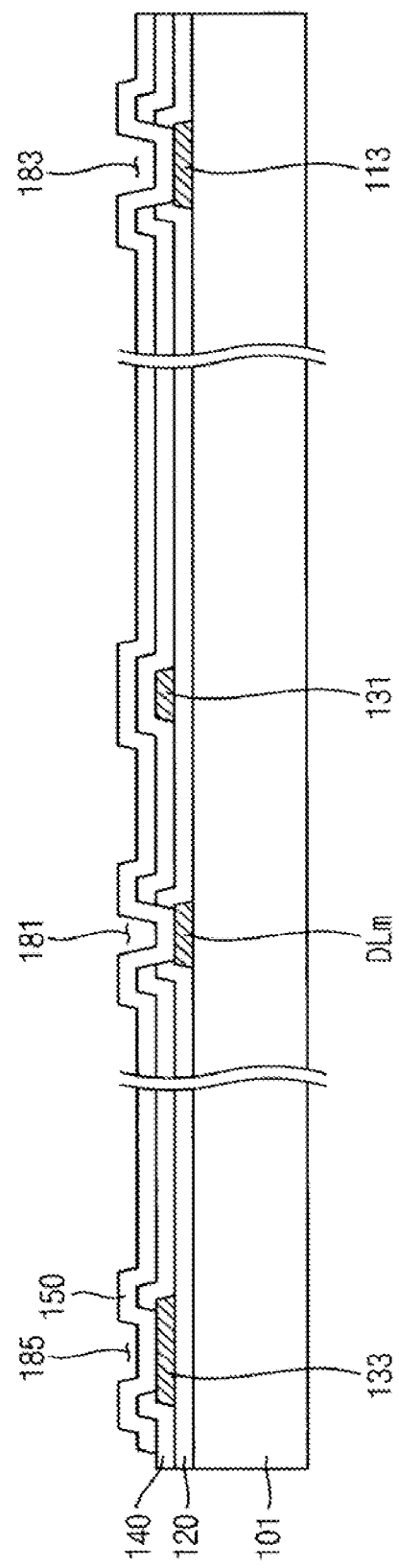

Referring to FIGS. 1 and 3C, first, second, and third contact holes 181, 183, and 185, respectively, are formed on gate insulating layer 140 by a photolithography process. First contact hole 181 exposes a portion of data line DLm to electrically connect data line DLm to source electrode 151. Second contact hole 183 exposes a portion of end portion 113 of data line DLm to form data pad DPm. Third contact hole 185 exposes a portion of end portion 133 of gate line GLn to form gate pad GPn.

A transparent conductor 150 is formed on first, second, and third contact holes 181, 183, and 185 and gate insulating layer 140. Transparent conductor 150 may be formed, for example, of a-ITON or IZON by a sputtering process. In one embodiment, transparent conductor 150 may be deposited by applying 3.7 kW to inflow gasses including argon, water vapor, oxygen, and/or nitrogen. In this regard, argon may be provided at a flow rate of 30 standard cubic centimeters per minute (sccm) for plasma discharge. Nitrogen, water vapor, and oxygen may be added at flow rates of 30, 1.5, and 0 sccm, respectively.

As the amount of the nitrogen used to form transparent conductor 150 increases, the surface defects of gate insulating layer 140 decrease, but the resistance of the transparent conductor 150 increases. In one embodiment, nitrogen may be provided at a flow rate in the range of about 20 sccm to about 40 sccm in order to reduce surface defects without significantly increasing the resistance of the transparent conductor 150.

Figure 3D:
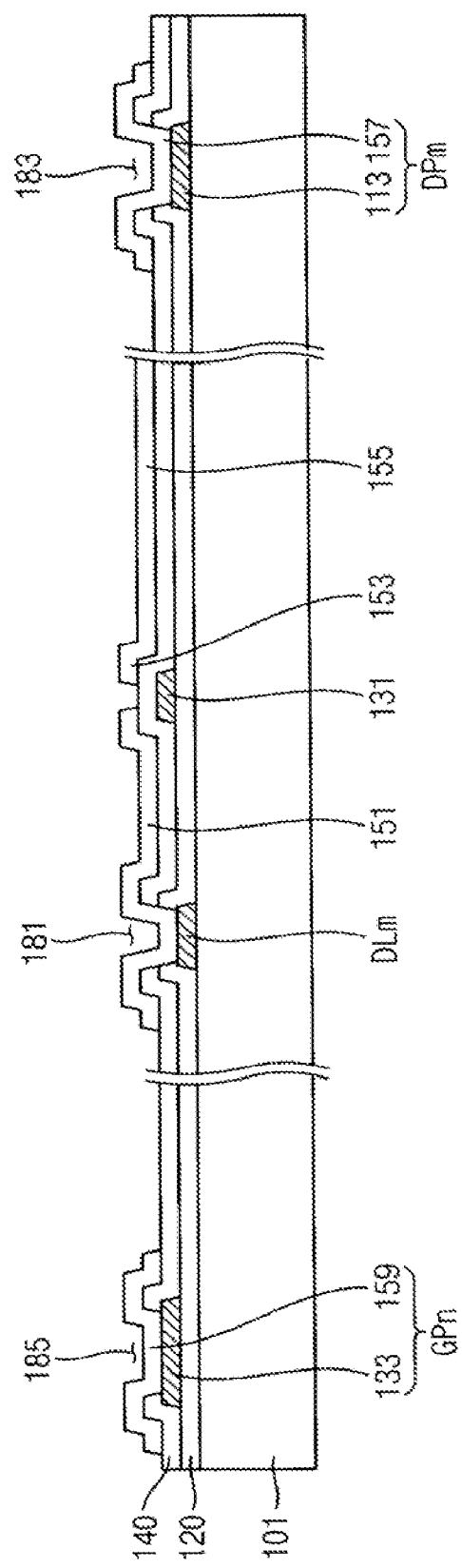

Referring to FIGS. 1 and 3D, transparent conductor 150 is patterned by a photolithography process to form source electrode 151, drain electrode 153, pixel electrode 155, and contact assistants 157 and 159. Source electrode 151 is electrically connected to data line DLm through first contact hole 181. Contact assistant 157 is electrically connected to end portion 113 of data line DLm through second contact hole 183 to form data pad DPm. Contact assistant 159 is electrically connected to end portion 133 of gate line GLn through third contact hole 185 to form gate pad GPn.

Figure 3E:
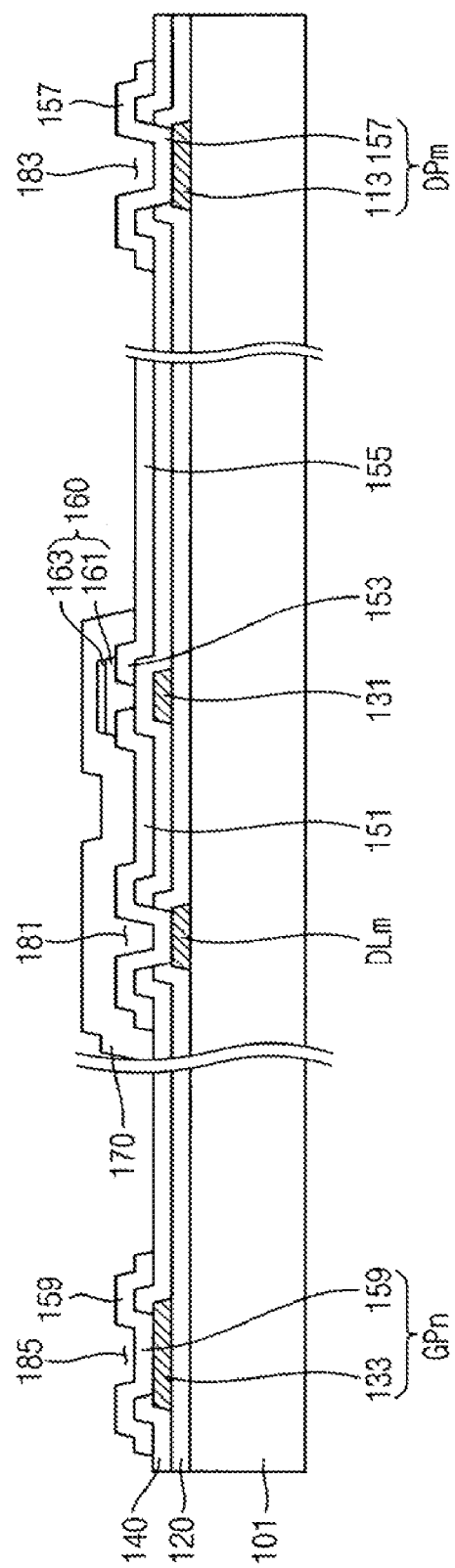

Referring to FIGS. 1 and 3E, organic semiconductor layer 161 and stopper layer 163 are sequentially formed above source electrode 151, drain electrode 153, and gate insulating layer 140, and are etched using a photolithography process to form channel 160. Stopper layer 163 protects organic semiconductor layer 161 during subsequent processing. A passivation layer 170 is formed on gate insulating layer 140, source electrode 151, drain electrode 153, and stopper layer 163 to protect organic thin film transistor OTFT.

Figure 4A:
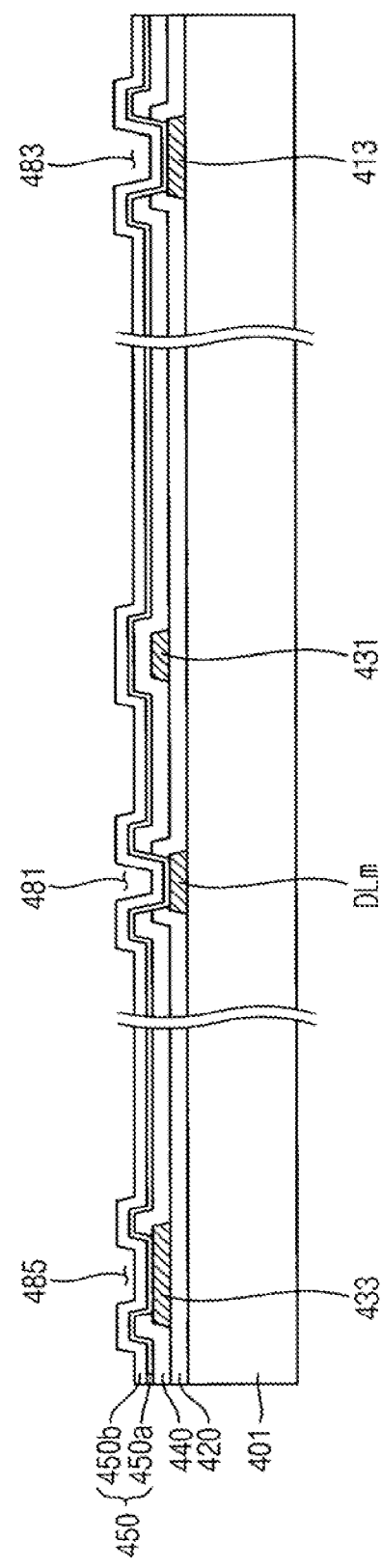

FIGS. 4A to 4B illustrate various process steps for manufacturing an array substrate according to another embodiment of this present invention. It will be appreciated that the array substrate of FIGS. 4A to 4B includes various structures similar to those previously described with regard to the array substrate of FIGS. 3A to 3E.

Referring to FIGS. 1 and 4A, a metal layer is deposited on a first base 401 and patterned to form data lines DLm and DLm+1 and an end portion 413. As illustrated, data lines DLm and DLm+1 are oriented in a longitudinal direction, and end portion 413 exhibits a comparatively large width. A base insulating layer 420 is formed on data lines DLm and DLm+1.

Gate lines GLn−1 and GLn, a gate electrode 431, an end portion 433 of gate line GLn, and storage electrode 135 are formed on base insulating layer 420. A gate insulating layer 440 is formed on gate lines GLn and a portion of base insulating layer 420.

First, second, and third contact holes 481, 483, and 485, respectively, are formed on gate insulating layer 440 by a photolithography process. First contact hole 481 exposes a portion of data line DLm to electrically connect data line DLm to source electrode 151. Second contact hole 483 exposes a portion of end portion 413 of data line DLm to form data pad DPm. Third contact hole 485 exposes a portion of end portion 433 of gate line GLn to form gate pad GPn.

A transparent conductor 450 is formed on first, second, and third contact holes 481, 483, and 485 and gate insulating layer 440. Transparent conductor 450 may be formed, for example, by a sputtering process. Transparent conductor 450 includes a lower conductor 450a and an upper conductor 450b. It will be appreciated that transparent conductor 450 exhibits a double-layered structure in comparison with transparent conductor 150 of FIGS. 3A to 3E.

Lower conductor 450a reduces the surface defects of gate insulating layer 440 caused by subsequent processes. Upper conductor 450b increases the transparency of transparent conductor 450, thereby improving light transmittance of pixel P.

In one embodiment, lower conductor 450a is formed of oxynitride containing In, Sn, Zn, Al, or Ga. If desirable, lower conductor 450a may be formed of a-ITON or IZON. For example, lower conductor 450a may be deposited by applying 3.7 kW input power to inflow gasses including argon, water vapor, oxygen, and/or nitrogen. In this regard, argon may be provided at a flow rate of 70 sccm for plasma discharge. Water vapor, oxygen, and nitrogen may be added at flow rates of 1.5 sccm, 0 sccm, and 30 sccm, respectively.

In one embodiment, upper conductor 450b is formed of oxide containing In, Sn, Zn, Al, or Ga. If desirable, upper conductor 450b may be formed of a-ITO or IZO. For example, upper conductor 450b may be deposited by applying 3.7 kW input power to inflow gasses including argon, water vapor, and/or oxygen. In this regard, argon may be provided at a flow rate of 100 sccm for plasma discharge. Water vapor and oxygen may be added at flow rates of 1.5 sccm and 0.5 sccm, respectively.

Referring to FIGS. 1 and 4B, transparent conductor 450 is patterned using a photolithography process to form source electrode 451, drain electrode 453, pixel electrode 455, and contact assistants 457 and 459. Source electrode 451 is electrically connected to data line DLm through first contact hole 481. Drain electrode 453 and pixel electrode 455 are integrally formed. Contact assistant 457 is electrically connected to end portion 413 of data line DLm through second contact hole 483 to form data pad DPm. Contact assistant 459 is electrically connected to end portion 433 of gate line GLn through third contact hole 485 to form gate pad GPn.

Organic semiconductor layer 461 and stopper layer 463 are sequentially formed on source electrode 451, drain electrode 453, and gate insulating layer 440. In one embodiment, organic semiconductor layer 461 is formed of pentacene, polythiophene, or linear polycyclic aromatic hydrocarbon such as naphthalene, anthracene, or tetracene. Stopper layer 463 protects organic semiconductor layer 461 during subsequent processing. A passivation layer 470 is formed on gate insulating layer 440, source electrode 451, drain electrode 453, and stopper layer 462 to protect and insulate organic thin film transistor OTFT.

Figure 5A:
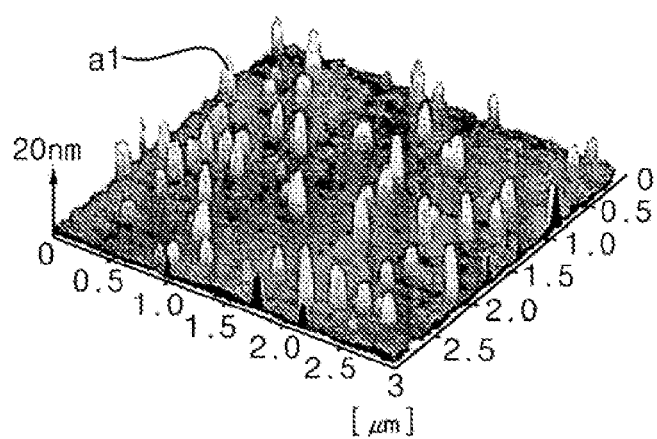
FIGS. 5A to 5F are pictures of an organic insulation layer of a display substrate under a plurality of test conditions in accordance with embodiments of the present invention.
Figure 5B:
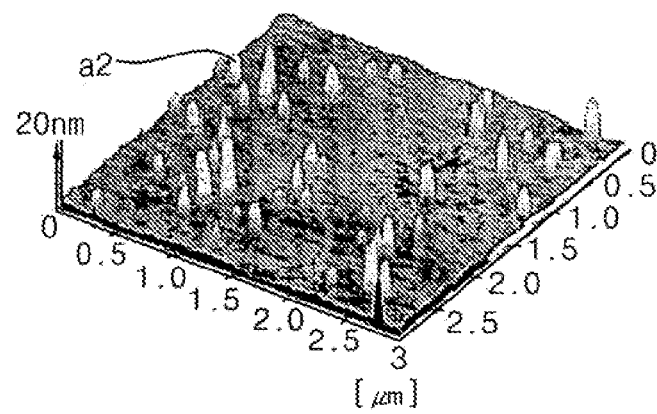
Figure 5C:
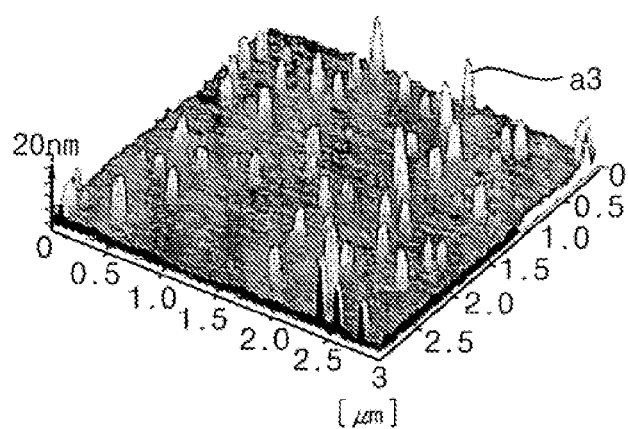
Figure 5D:
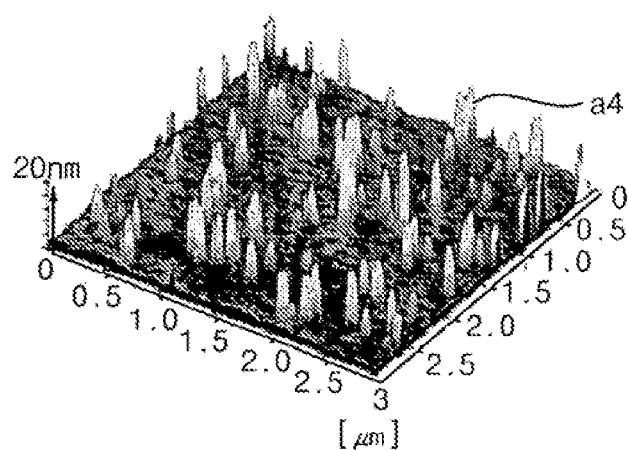
Figure 5E:
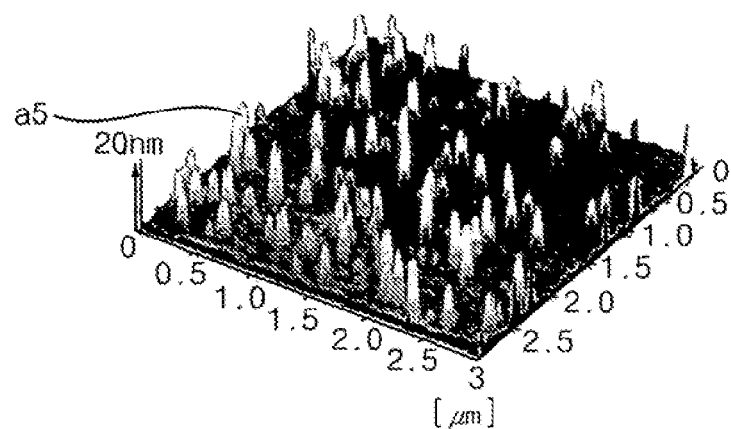
Figure 5F:
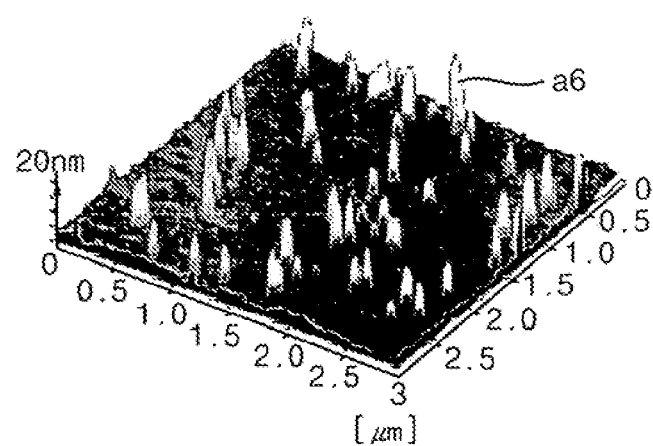
Figure 6:
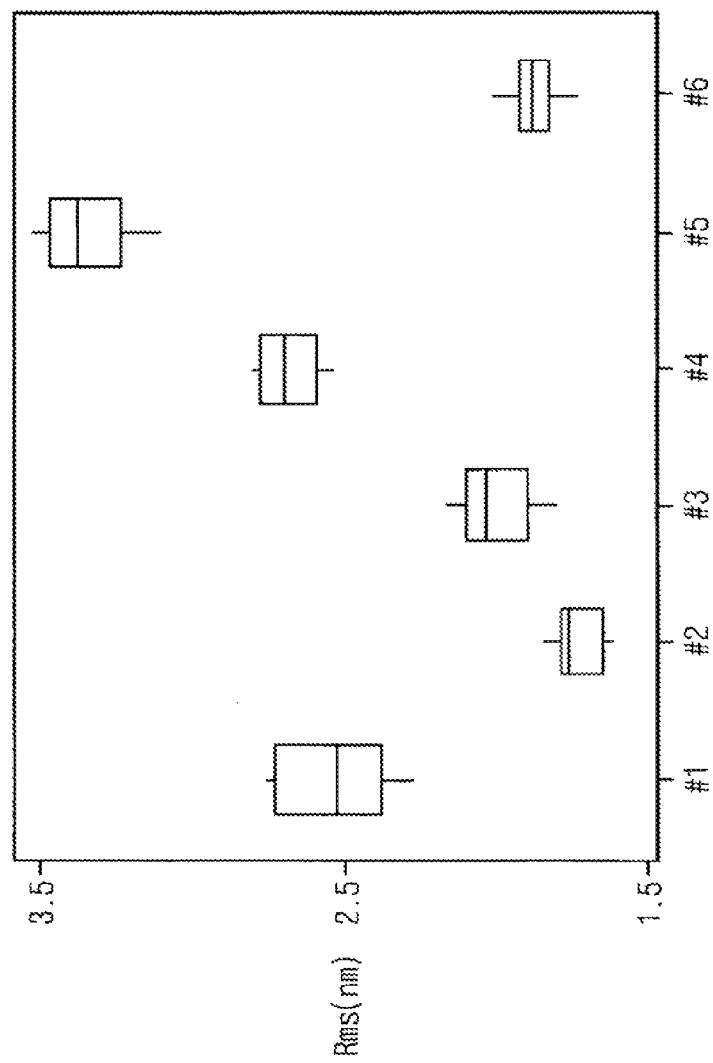
FIG. 6 is a graph illustrating measurements corresponding to FIGS. 5A to 5F in accordance with embodiments of the present invention.

The following examples identify effects of including oxynitrides in a transparent conductor in accordance with various embodiments of the present invention. Table 1 shows examples 1 to 6 in which a-ITO is deposited on a gate insulation layer using magnetron DC sputtering under different test conditions. FIGS. 5A to 5F are pictures of an organic insulation layer under test conditions corresponding to examples 1 to 6, respectively. FIG. 6 is a graph illustrating measurements corresponding to FIGS. 5A to 5F.

TABLE 1

| Example | Power(kw) | Scan No. | $H_2O$(sccm) | $O_2$(sccm) | Ar(sccm) |
|---|---|---|---|---|---|
| 1 | 3.4 | 4 | 1.5 | 0.5 | 100 |
| 2 | 1.85 | 8 | 1.5 | 0.5 | 100 |
| 3 | 3.7 | 4 | 1.5 | 0 | 100 |
| 4 | 3.7 | 4 | 1.5 | 1.5 | 100 |
| 5 | 3.7 | 4 | 1.5 | 2.5 | 100 |
| 6 | 3.7 | 4 | 3 | 0.5 | 100 |

In the examples of Table 1, argon is used for a plasma discharge and a-ITO is deposited with various amounts of applied power, water vapor, and oxygen gas as shown in Table 1. The surface of the gate insulating layer is analyzed after removal of the deposited a-ITO by a wet etching.

In example 1, 3.7 kw input power, 4 magnet scans, 1.5 sccm of water vapor, and 0.5 sccm of oxygen are used to form a-ITO. This condition is a standard normally used. Referring to FIGS. 5A and 6, the surface of the gate insulating layer of example 1 exhibits protrusions a1 ranging in height from about 1.9 nm to about 2.7 nm.

In example 2, 1.85 kw input power, 8 magnet scans, 1.5 sccm of water vapor, and 0.5 sccm of oxygen are used to form a-ITO. It will be appreciated that the input power of example 2 is less than for that for example 1. Referring to FIGS. 5B and 6, the surface of the gate insulating layer of example 2 exhibits protrusions a2 ranging in height from about 1.6 nm to about 1.7 nm. In this regard, it will be appreciated that as the input power decreases from 3.7 kw to 1.85 kw, the height of the protrusions a1 on the surface of the gate insulating layer decreases.

In examples 3 to 5, the flow rate of oxygen is adjusted. Specifically, oxygen flow rates of 0 sccm, 1.5 sccm, and 2.5 sccm are used in the deposition of a-ITO in examples 3, 4, and 5, respectively. Referring to FIGS. 5C-E and 6, it will be appreciated that the heights of protrusions a3-a5 on the surface of the gate insulating layer increase as the oxygen flow rate increases. In this regard, protrusions a5 of example 5 (which uses the most oxygen of examples 3-5) exhibit the greatest height in a range from about 3.4 nm to about 3.5 nm.

In example 6, 3.7 kw input power, 4 magnet scans, 3 sccm of water vapor, and 0.5 sccm of oxygen are used to deposit a-ITO. In this regard, it will be appreciated that example 6 uses a greater amount of water vapor than example 1. Referring to FIGS. 5F and 6, the surface of the gate insulating layer of example 6 exhibits protrusions a6 ranging in height from about 1.65 nm to about 1.75 nm. Accordingly, it will be appreciated that as the amount of water vapor increases from 1.5 sccm to 3 sccm, the height of the protrusions decreases.

According to the results above, the roughness of the surface of the gate insulating layer (i.e., the height of the protrusions formed thereon) decreases as input power decreases or as the amount of water vapor increases. However, controlling the amount of input power and water vapor added during the manufacture of a display substrate can introduce additional complexity into the manufacturing process.

Figure 7A:
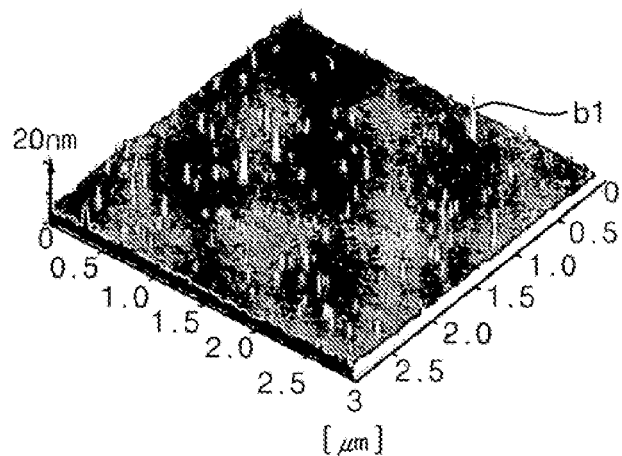
FIGS. 7A to 7F are pictures of an organic insulation layer of a display substrate for another plurality of test conditions in accordance with embodiments of the present invention.
Figure 7B:
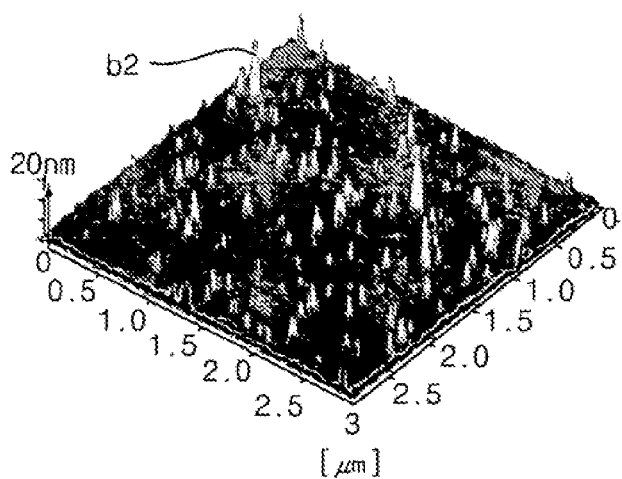
Figure 7C:
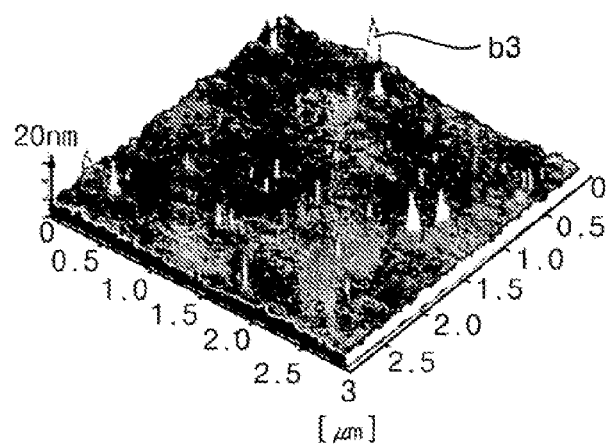
Figure 7D:
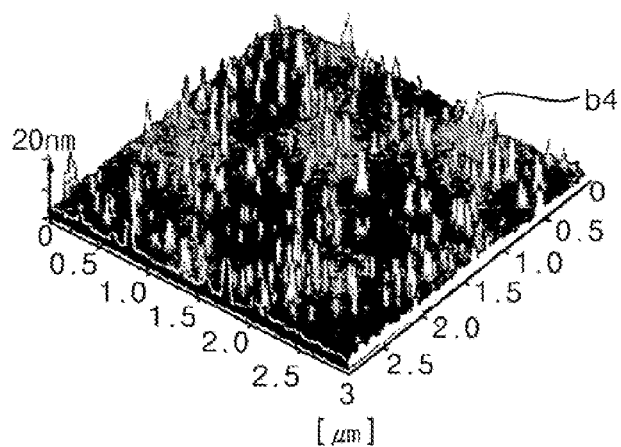
Figure 7E:
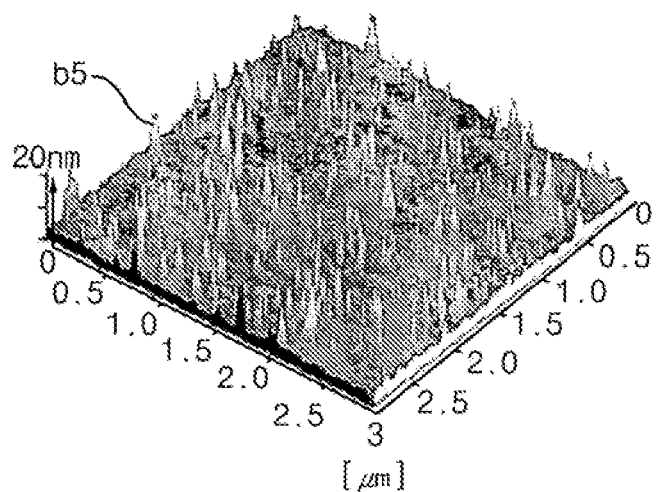
Figure 7F:
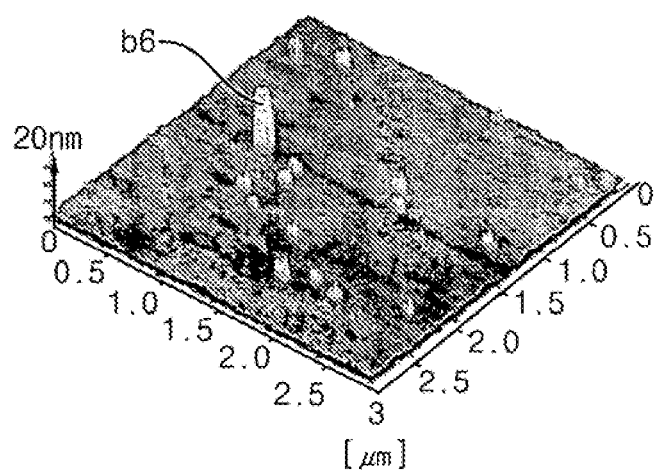
Figure 8:
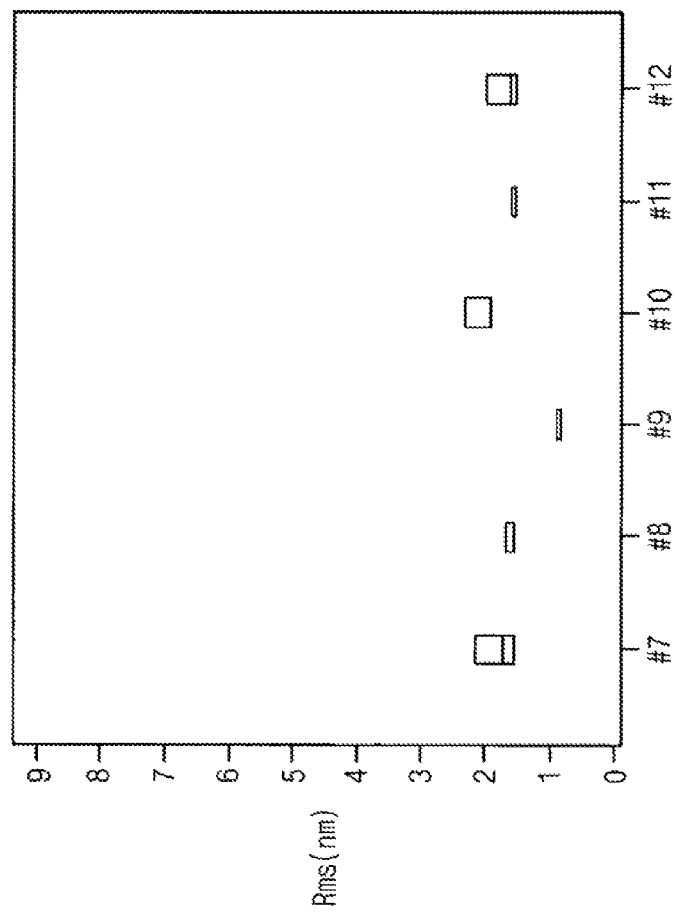
FIG. 8 is a graph illustrating measurements corresponding to FIGS. 7A to 7F in accordance with embodiments of the present invention.

Table 2 shows examples 7 to 12 in which a-ITON is deposited on an organic insulation layer using magnetron DC sputtering under different test conditions. FIGS. 7A to 7F are pictures of a gate insulation layer under test conditions corresponding to examples 7 to 12, respectively. FIG. 8 is a graph illustrating measurements corresponding to FIGS. 7A to 7F.

TABLE 2

| Example | Power (kw) | Scan No. | $H_2O$ (sccm) | $O_2$ (sccm) | Ar (sccm) | $N_2$ (sccm) |
|---|---|---|---|---|---|---|
| 7 | 3.7 | 4 | 1.5 | 0 | 90 | 10 |
| 8 | 3.7 | 4 | 1.5 | 0 | 80 | 20 |
| 9 | 3.7 | 4 | 1.5 | 0 | 70 | 30 |
| 10 | 1.85 | 8 | 1.5 | 0 | 90 | 10 |
| 11 | 1.85 | 8 | 1.5 | 0 | 80 | 20 |
| 12 | 1.85 | 8 | 3 | 0 | 100 | 0 |

In the examples of Table 2, argon is used for a plasma discharge and a-ITON is deposited with various amounts of applied power and nitrogen as shown in Table 2. The surface of the gate insulating layer is analyzed after removal of the deposited a-ITON by a wet etching.

In examples 7 to 9, the amount of nitrogen is adjusted. In example 7, 3.7 kw input power, 4 magnet scans, 1.5 sccm of water vapor, 0 sccm of oxygen, 90 sccm of argon, and 10 sccm of nitrogen are used to deposit a-ITON. Referring to FIGS. 7A and 8, the surface of the gate insulating layer of example 7 exhibits protrusions b1 ranging in height from about 1.5 nm to about 2.5 nm. It will be appreciated that the height of protrusions b1 are less than the height of protrusions a1 in example 1.

In examples 8 and 9, the amount of nitrogen is changed to 20 sccm and 30 sccm, respectively. Referring to FIGS. 7B, 7C, and 8, protrusions b2 of example 8 range in height from about 1.5 nm to about 1.8 nm height, and protrusions b3 of example 9 exhibit heights less than about 1 nm. Accordingly, it will be appreciated from examples 7 to 9 that the roughness of the surface of the gate insulating layer (i.e. the height of the protrusions formed thereon) decreases as the amount of nitrogen increases.

In example 10, 1.8 kw input power, 8 magnet scans, 1.5 sccm of water vapor, 0 sccm of oxygen, 90 sccm of argon, and 10 sccm of nitrogen are used to deposit a-ITON. The input power decreases from 3.7 kw for example 7 to 1.8 kw. Referring to FIGS. 7D and 8, protrusions b4 of example 10 exhibit a height of about 2 nm.

In example 11, 1.85 kw input power, 8 magnet scans, 1.5 sccm of water vapor, 0 sccm of oxygen, 80 sccm of argon, and 20 sccm of nitrogen are used to deposit a-ITON. Referring to FIGS. 7E and 8, protrusions b5 of example 11 exhibit a height of about 1.5 nm.

In view of the above examples, it will be appreciated that the input power in example 10 (i.e., 1.85 kw) is lower than in example 7 (i.e., 3.7 kw). However, the protrusions b1 and b4 of examples 7 and 10 exhibit similar heights. It will also be appreciated that the input power in example 11 (i.e., 1.85 kw) is lower than in example 8 (i.e., 3.7 kw). However, the protrusions b2 and b5 of examples 7 and 11 exhibit similar heights.

Accordingly, it will be appreciated that the roughness of the surface of the gate insulating layer (i.e., the height of the protrusions formed thereon) decreases as the amount of nitrogen increases and is not dependent on the input power. In particular, when 30 sccm of nitrogen is used as in example 9, the roughness of the gate insulating layer is significantly improved.

In example 12, 1.85 kw input power, 8 magnet scans, 3 sccm of water vapor, 0 sccm of oxygen, 0 sccm of nitrogen, and 100 sccm of argon are used to deposit a-ITON. In this regard, it will be appreciated that the amount of water vapor used in example 12 is higher than in examples 7-11, and nitrogen is not added in example 12. Referring to FIGS. 7F and 8, protrusions b6 of example 12 exhibit a height in the range of about 1.5 nm to about 2 nm. Accordingly, it will be appreciated that when the amount of water vapor is increased without any nitrogen added, the surface roughness of the gate insulating layer is not improved in comparison to example 9 which uses 30 sccm of nitrogen. However, as illustrated in the examples above, the roughness of the surface of the gate insulating layer is improved as the amount of nitrogen increases.

In accordance with various embodiments of the present invention described herein, a transparent conductor formed of oxynitride can reduce surface defects on a gate insulating layer and accordingly reduce defects in an organic semiconductor layer formed on the gate insulating layer. As a result, operation of an associated organic thin film transistor can be improved. In addition, by reducing the roughness of the surface of the gate insulating layer, the transmittance of the transparent conductor formed on the gate insulating layer can be improved.

As those of skill in this art will appreciate, many modifications, substitutions and variations can be made in the materials, apparatus, configurations, and methods of the present disclosure without departing from the spirit and scope of its teachings. In light of this, the scope of the present disclosure should not be limited to that of the particular embodiments illustrated and described herein, as they are only exemplary in nature.

What is claimed is:

1. A method for manufacturing a display substrate comprising:
   forming a data line on a base, wherein the data line is oriented in a first direction;
   forming a gate line and a gate electrode electrically connected to the gate line, wherein the gate line is oriented in a second direction that crosses the first direction;
   forming a first insulating layer on the gate line and on the gate electrode, wherein the first insulating layer comprises a ferroelectric material;
   forming a transparent conductor on and in contact with the ferroelectric material of the insulating layer, wherein the transparent conductor comprises a transparent oxynitride in contact with the ferroelectric material and wherein the ferroelectric-contacting oxynitride has a nitrogen concentration that is less than that which would significantly increase resistance of the transparent conductor but is sufficiently large to inhibit formation of surface defects in the contacted ferroelectric material; and
   patterning the transparent conductor to form a source electrode electrically connected to the data line, a pixel electrode, and a drain electrode integrally formed with the pixel electrode.

2. The method of claim 1, further comprising forming a second insulating layer on the data line and the base.

3. The method of claim 1, wherein forming the first insulating layer comprises forming a contact hole to expose a portion of the data line.

4. The method of claim 1, further comprising forming an organic semiconductive layer on the source electrode and on the drain electrode, and above the gate electrode.

5. The method of claim 4, further comprising forming a passivation layer on the organic semiconductive layer, on the source electrode, and on the drain electrode.

6. The method of claim 1, wherein the forming of the transparent conductor comprises providing nitrogen gas at a flow rate in a range of about 20 standard cubic centimeters per minute (sccm) to about 40 sccm.

7. The method of claim 1, wherein the oxynitride includes at least one member selected from a group consisting of indium (In), tin (Sn), zinc (Zn), aluminum (Al), and gallium (Ga).

8. The method of claim 7, wherein the forming of the transparent conductor comprises:
   forming a lower conductor by depositing the transparent oxynitride on the first insulating layer; and
   forming an upper conductor by depositing a transparent oxide on the lower conductor.

9. The method of claim 8, wherein the transparent oxide includes at least one member selected from a group consisting of indium (In), tin (Sn), zinc (Zn), aluminum (Al), and gallium (Ga).

* * * * *